United States Patent
Tsai et al.

(10) Patent No.: US 6,383,936 B1
(45) Date of Patent: May 7, 2002

(54) METHOD FOR REMOVING BLACK SILICON IN SEMICONDUCTOR FABRICATION

(75) Inventors: Tzu-Ching Tsai, Taichung Hsien; Hung-Hsin Lin, Kaohsiung, both of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/875,908

(22) Filed: Jun. 8, 2001

(30) Foreign Application Priority Data

Apr. 20, 2001 (TW) .................................. 090109495 A

(51) Int. Cl.$^7$ .................... H01L 21/00; H01L 21/027
(52) U.S. Cl. .................. 438/702; 438/758; 438/778
(58) Field of Search ................................ 438/702, 700, 438/778, 758

(56) References Cited

U.S. PATENT DOCUMENTS 6,033,997 A * 3/2000 Perng ......................... 438/765
6,190,955 B1 * 2/2001 Ilg et al. ..................... 438/238

* cited by examiner

Primary Examiner—Michael S. Lebentritt
Assistant Examiner—Beth Elise Owens
(74) Attorney, Agent, or Firm—Birch, Stewart, Kolasch & Birch, LLP

(57) ABSTRACT

A method for removing black silicon in semiconductor fabrication is disclosed. First, a trench is formed in a semiconductor substrate having a pad dielectric layer and a hard mask layer. Then, the hard mask layer is removed. A photoresist layer covers the trench and only black silicon created at the edge of the semiconductor substrate during formation of the trench is left uncovered. Finally, the black silicon is removed.

5 Claims, 3 Drawing Sheets

METHOD FOR REMOVING BLACK SILICON IN SEMICONDUCTOR FABRICATION

BACKGROUND OF THE INVENTION

1. Field of the Invention

The invention relates generally to semiconductor fabrication, and more particularly, to the removal of black silicon in semiconductor fabrication.

2. Description of the Prior Art

In the fabrication of integrated circuits (ICs), trenches are typically formed in a substrate, such as a silicon wafer. Deep trenches (DTs), for example, serve as capacitors for an array of memory cells.

Conventional techniques for forming the trench capacitor deposits a pad dielectric layer and a hard mask layer on the semiconductor substrate. A patterned photoresist layer is then formed over the hard mask layer whereby a portion of the hard mask layer is exposed. The exposed hard mask, together with the pad dielectric, is removed by etch. The etch continues to form a deep trench in the semiconductor substrate. The remaining hard mask is removed, and subsequently, some elements according to the desired IC design, such as a lower electrode, collar oxide, upper electrode and buried strap, are separately formed.

People in the semiconductor industry have found that needle-type surfaces usually between about 3 to 7 microns in length are formed at the edges of the wafer after etching DTs. This needle-type surface is referred to as "black silicon". Black silicon forms because the remaining pad dielectrics are left on the wafer surface during DT etching. The remaining pad dielectric protects the underlying silicon from being etched. As such, the portions unprotected by the island pad dielectric continue to be etched while the protected portions remain. Therefore, the needle-type surface is formed at the protected portions of silicon substrate during reactive ion etch (RIE).

Black silicon formed during RIE is easily broken off, in turn becoming particles, and can adversely impact manufacturing yield.

As shown in FIGS. 1A and 1B, one conventional technique of removing the black silicon 11 in semiconductor fabrication is to coat the wafer with a photoresist 12 while leaving an approximately 3 mm wide region around the edge of the wafer left uncovered with the photoresist, exposing the black silicon formed after forming a DT in a semiconductor substrate 10.

Although the coating photoresist 12 can expose the black silicon, some DT patterns at the edge of the wafer are uncovered. It is therefore necessary to take a longer time to remove the pad hard mask and the pad dielectric layer to prevent any formation of particles. Also, the coating photoresist 12 may cause die loss at the edge of the wafer.

In addition, the buried strap has a test pattern. To avoid photoresist cracks on the test pattern of the longitudinal buried strap, a conventional $O_2$ ashing is applied before coating the photoresist 12. The process of removing black silicon and hard mask then follows.

SUMMARY OF THE INVENTION

It is therefore an object of the invention to provide a photoresist layer covering the whole surface of the wafer to reduce the processing time for removing black silicon and improve manufacturing yield.

It is another object of the invention to streamline the processing steps for removing the hard mask and to obviate the need for $O_2$ ashing used to prevent cracks in the photoresist layer on the test pattern of the buried strap.

To achieve these objects and advantages, and in accordance with the purpose of the invention, as embodied and broadly described herein, the invention is directed towards a method for removing black silicon in semiconductor fabrication, comprising the steps of removing a hard mask on a semiconductor substrate having a deep trench; coating a photoresist layer which covers in a sufficient manner the edge of the substrate; and removing black silicon unprotected by the photoresist layer.

BRIEF DESCRIPTION OF THE DRAWINGS

These and other features and advantages of the present invention will be better understood by considering the following detailed description of the invention which is presented with the attached drawings.

DETAILED DESCRIPTION OF THE PREFERRED EMBODIMENT

Figure 1A:
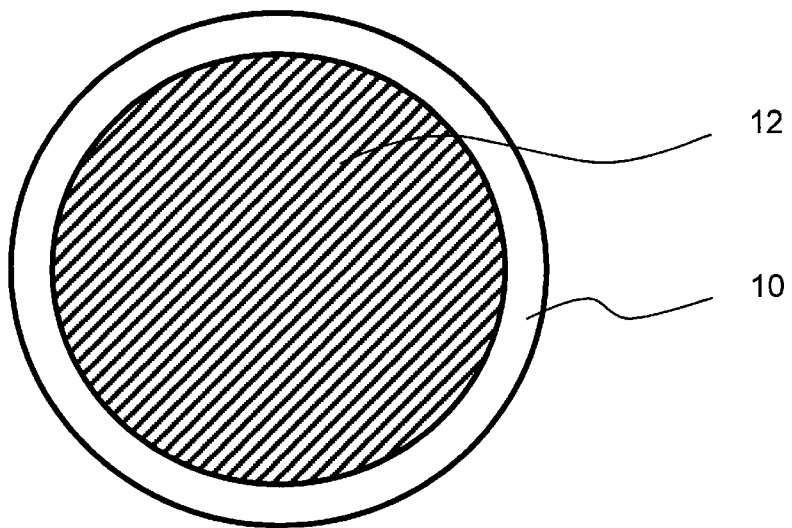
FIGS. 1A and 1B show a top view and a cross-sectional view of a conventional method for removing black silicon in semiconductor fabrication, depicting the relationship between the photoresist, the semiconductor substrate and the black silicon.
Figure 1B:
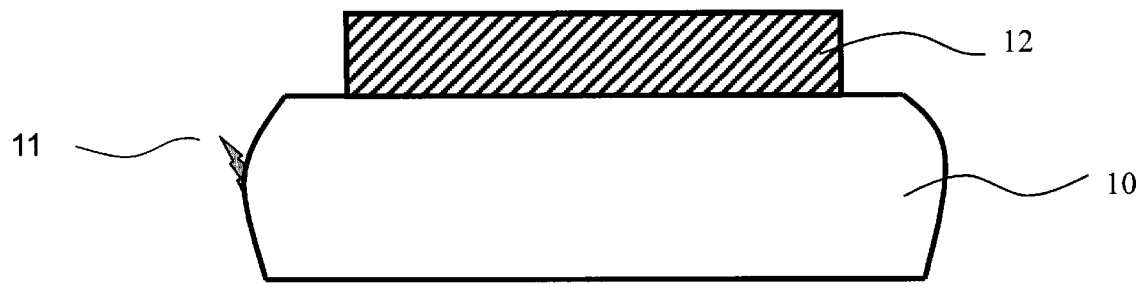
Figure 2A:
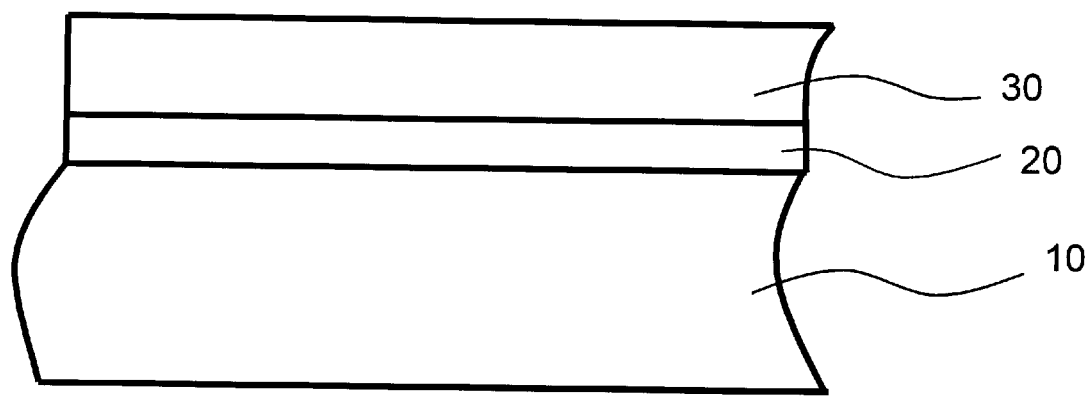
FIGS. 2A, 2B, 2C and 2D show cross-sectional views depicting the processing steps of removing black silicon in a semiconductor fabrication, according to the present invention.

Referring to FIG. 2A, a pad dielectric layer 20 and a hard mask layer 30 are formed on a semiconductor substrate 10, respectively. The semiconductor substrate can be any conventional semiconductor substrate, preferably in wafer form. The pad dielectric layer 20 may include silicon oxide having a thickness of about 50 angstroms and/or silicon nitride having a thickness of about 2,000 angstroms. A hard mask of borosilicate glass (BSG) having a thickness of about 10,000 angstroms is preferred.

Figure 2B:
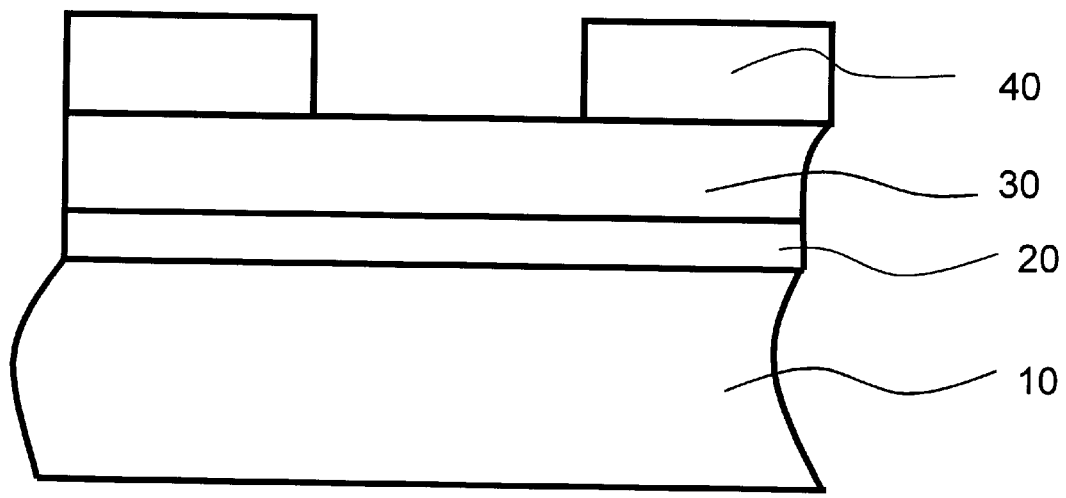

Referring to FIG. 2B, a patterned photoresist layer 40 is formed and part of the hard mask 30 is exposed. The exposed part of the hard mask 30 and the underlying pad dielectric layer 20 are etched by any conventional anisotropic etching technique such as reactive ion etching or other dry etching technique. The etch continues down to the substrate to form a deep trench 50.

Figure 2C:
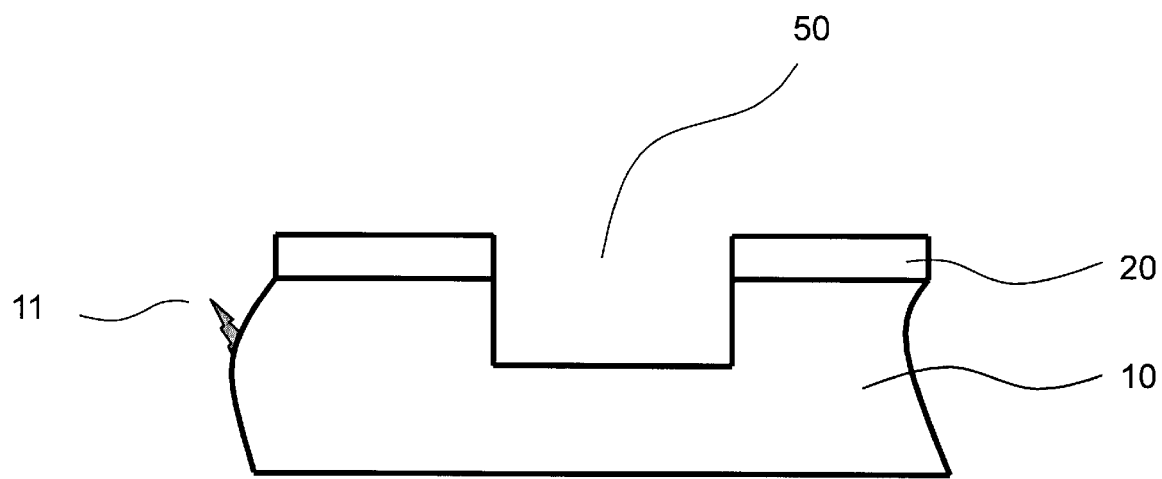

Referring to FIG. 2C, the remaining BSG layer 30 is removed once the etching is completed. The BSG layer 30 is preferably selectively removed with diluted HF so that the adhesion of photoresist 60 to silicon substrate 10 is improved as the photoresist 60 is coated to prevent the photoresist layer 60 from cracking in the following test pattern of buried strap.

Figure 2D:
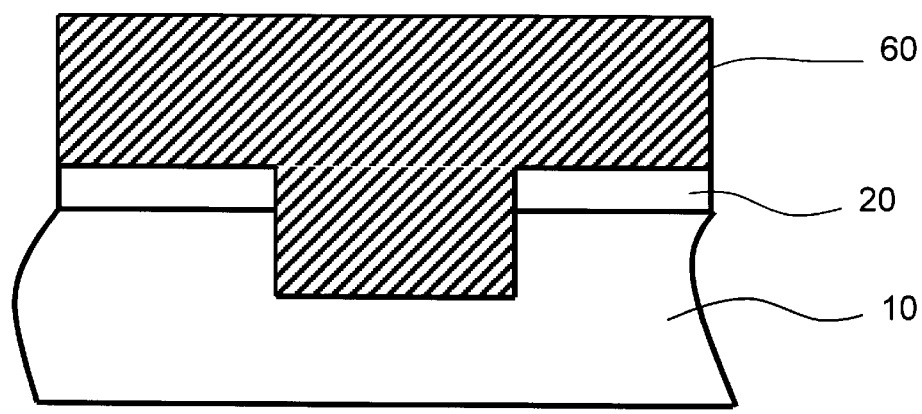

Referring to FIG. 2D, the photoresist layer 60 is coated, preferably covering the deep trench 50 and leaving uncovered only black silicon 11, for quick removal of the black silicon 11. Experiments in accordance with the invention indicate that the time needed to remove the undesired black silicon 11 has decreased from 180 seconds to 90 seconds. Thus, IC manufacturing yield is significantly increased.

Additional advantages and modifications will readily occur to those skilled in the art. Therefore, the invention in its broader aspect is not limited to the specific details, and illustrated example shown and described herein. Accordingly, various modifications may be made without departing from the spirit or scope of the general inventive concept as defined by the appended claims and their equivalents.

What is claimed is:

1. A method for removing black silicon in semiconductor fabrication, comprising:

forming a trench in a semiconductor substrate having a pad dielectric layer and a hard mask layer;

removing said hard mask layer;

coating a photoresist layer to cover said semiconductor substrate and said trench and leaving uncovered only black silicon created at the edge of said semiconductor substrate during formation of said trench; and removing said black silicon.

2. The method of claim 1, wherein said pad dielectric layer includes silicon oxide.

3. The method of claim 1, wherein said pad dielectric layer includes silicon nitride.

4. The method of claim 1, wherein said hard mask layer is borosilicate glass.

5. The method of claim 1, wherein said hard mask layer is selectively removed with diluted HF.

* * * * *